(12) United States Patent
Ahn

(10) Patent No.: US 11,863,185 B2
(45) Date of Patent: Jan. 2, 2024

(54) OSCILLATOR CIRCUIT, SEMICONDUCTOR INTEGRATED CIRCUIT DEVICE AND METHOD FOR FREQUENCY CORRECTION OF OSCILLATOR CIRCUIT

(71) Applicant: LX Semicon Co., Ltd., Daejeon (KR)

(72) Inventor: Yong Sung Ahn, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/965,292

(22) Filed: Oct. 13, 2022

(65) Prior Publication Data

US 2023/0118580 A1    Apr. 20, 2023

(30) Foreign Application Priority Data

Oct. 20, 2021  (KR) .................. 10-2021-0140520
May 26, 2022  (KR) .................. 10-2022-0064761

(51) Int. Cl.
  *H03K 3/00* (2006.01)
  *H03K 3/011* (2006.01)
  *H03K 5/00* (2006.01)

(52) U.S. Cl.
  CPC ......... *H03K 3/011* (2013.01); *H03K 5/00006* (2013.01)

(58) Field of Classification Search
  CPC . H03H 7/38; B60L 53/12; B60L 53/32; H01F 27/2823; H02J 50/05
  USPC ....................................................... 327/114
  See application file for complete search history.

(56) References Cited

U.S. PATENT DOCUMENTS

| 6,292,066 B1 * | 9/2001 | Shibuya .................. | H03L 1/026 331/177 V |
| 7,583,157 B2 * | 9/2009 | Sakurai .................... | H03L 7/183 331/66 |
| 7,649,426 B2 * | 1/2010 | Stolpman ................. | H03L 1/022 331/70 |
| 8,237,515 B2 * | 8/2012 | Keating .................. | H03L 1/028 331/158 |
| 8,669,825 B2 * | 3/2014 | Terasawa ................ | H03L 1/022 331/158 |
| 8,710,888 B2 * | 4/2014 | Vyas ....................... | H03L 1/026 327/243 |
| 10,389,363 B2 * | 8/2019 | Owaki .................... | H03B 5/04 |
| 2019/0331537 A1 * | 10/2019 | Babitch .................. | G01S 19/01 |
| 2020/0292395 A1 * | 9/2020 | Babitch .................. | H03L 1/022 |
| 2023/0118580 A1 * | 4/2023 | Ahn ....................... | H03K 3/011 327/114 |

FOREIGN PATENT DOCUMENTS

| JP | H10256831 A | 9/1998 |
| KR | 101090650 B1 | 12/2011 |
| KR | 20190124628 A | 11/2019 |

* cited by examiner

*Primary Examiner* — Ryan Jager
(74) *Attorney, Agent, or Firm* — ROTHWELL, FIGG, ERNST & MANBECK, P.C.

(57) ABSTRACT

The present embodiment relates to an oscillator circuit, a semiconductor integrated circuit device and a method for frequency correction of an oscillator circuit, and more particularly, to an oscillator circuit, a semiconductor integrated circuit device and a method for frequency correction of an oscillator circuit capable of stably maintaining an output frequency of a clock signal even when a temperature of the semiconductor integrated circuit device changes.

19 Claims, 11 Drawing Sheets

OSCILLATOR CIRCUIT, SEMICONDUCTOR INTEGRATED CIRCUIT DEVICE AND METHOD FOR FREQUENCY CORRECTION OF OSCILLATOR CIRCUIT

CROSS REFERENCE TO RELATED APPLICATION

This application claims priority to Republic of Korea Patent Application No. 10-2021-0140520, filed on Oct. 20, 2021, and Korea Patent Application No. 10-2022-0064761, filed on May 26, 2022, which is hereby incorporated by reference in its entirety.

BACKGROUND

1. Field of Technology

The present disclosure relates to an oscillator circuit, a semiconductor integrated circuit device and a method for frequency correction of an oscillator circuit.

2. Related Technology

Semiconductor integrated circuit devices such as a timing controller (T-CON) of a display device, a source driver IC (SDIC: Source Driver Integrated Circuit), an application processor (AP) of a smartphone, and a central processing unit (CPU) of a computer include an oscillator circuit which outputs a clock signal.

In general, an oscillator circuit is a temperature-sensitive circuit, and the output frequency of a clock signal output from the oscillator circuit may be changed by heat generated according to the operation of a semiconductor integrated circuit device.

In other words, the output frequency of a clock signal may change according to a change in the temperature of a semiconductor integrated circuit device, and thus the semiconductor integrated circuit device may operate unstably.

Accordingly, there is a need to provide an oscillator circuit capable of stably maintaining the output frequency of a clock signal even when the temperature of a semiconductor integrated circuit device changes.

The discussions in this section are only to provide background information and does not constitute an admission of prior art.

SUMMARY

In this background, an aspect of the present disclosure provides a technology capable of stably maintaining an output frequency of a clock signal even when a temperature of a semiconductor integrated circuit device changes.

In one aspect, the present embodiment provides an oscillator circuit, comprising: a temperature sensor to sense a temperature inside a semiconductor integrated circuit device and to output a temperature sensing value; an error correction circuit to store a first error correction value, for correcting a frequency error of a clock signal when the temperature inside the semiconductor integrated circuit device is a first temperature, and a second error correction value, for correcting the frequency error of the clock signal when the temperature inside the semiconductor integrated circuit device is a second temperature higher than the first temperature and generates an error correction value corresponding to the temperature sensing value by using the first error correction value, the second error correction value, and the temperature sensing value; and an oscillator to correct the frequency error of the clock signal according to the temperature inside the semiconductor integrated circuit device by setting at least one of a bias, a resistance value, and a capacitor value according to the error correction value and outputs the clock signal and sets.

In another aspect, the present embodiment provides a semiconductor integrated circuit device, comprising: an oscillator circuit, protected by a case, comprising: an error correction circuit to store a first error correction value, for correcting a frequency error of a clock signal when an ambient temperature of the case is a first temperature, and a second error correction value, for correcting the frequency error of the clock signal when the ambient temperature of the case is a second temperature, which is higher than the first temperature, to receive a temperature sensing value for the ambient temperature of the case from an external circuit, and to generate an error correction value corresponding to the temperature sensing value by using the first error correction value, the second error correction value, and the temperature sensing value; and an oscillator to correct the frequency error of the clock signal according to the ambient temperature by setting at least one of a bias, a resistance value, and a capacitor value according to the error correction value and to output the clock signal and sets; and a digital circuit, protected by the case, operating in synchronization with the clock signal.

In another aspect, the present embodiment provides a method for frequency correction of an oscillator circuit, comprising: acquiring, by the oscillator circuit of a semiconductor integrated circuit device, a temperature sensing value for a temperature of the semiconductor integrated circuit device; extracting, from an internal memory, a first error correction value, for correcting a frequency error of a clock signal when a temperature of the semiconductor integrated circuit device is a first temperature, and a second error correction value, for correcting the frequency error of the clock signal when the temperature of the semiconductor integrated circuit device is a second temperature higher than the first temperature; generating an error correction value corresponding to the temperature sensing value by using the first error correction value, the second error correction value, and the temperature sensing value; and setting at least one of a bias, a resistance value, and a capacitor value according to the error correction value in order to control a frequency of the clock signal and outputting the clock signal in which the frequency error is corrected according to the temperature of the semiconductor integrated circuit device.

As described above, according to the present embodiment, an oscillator circuit stores an error correction value under a room temperature and an error correction value under a high temperature, and generates an error correction value according to a temperature of a semiconductor integrated circuit device using two pre-stored error correction values. Hence, the oscillator circuit may operate insensitively to temperature changes.

DETAILED DESCRIPTION OF EMBODIMENTS

Figure 1:
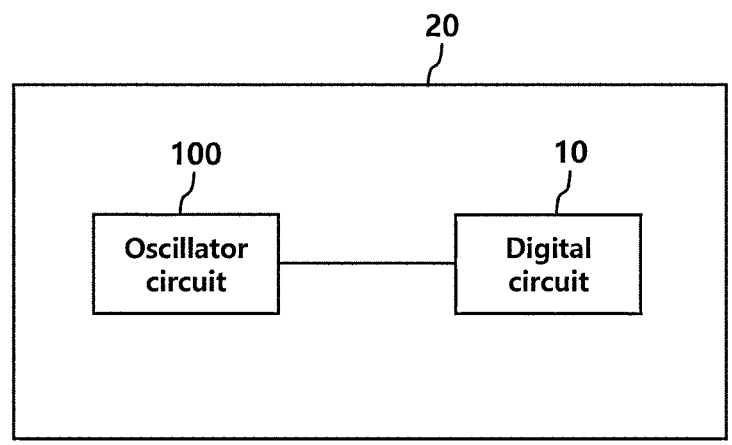
FIG. 1 is a diagram schematically illustrating a semiconductor integrated circuit device including an oscillator circuit according to an embodiment.

FIG. 1 is a diagram schematically illustrating a semiconductor integrated circuit device including an oscillator circuit according to an embodiment.

An oscillator circuit 100 according to an embodiment may be included in semiconductor integrated circuit devices such as a timing controller (T-CON) of a display device, a source driver IC (SDIC: Source Driver Integrated Circuit), an application processor (AP) of a smartphone, and a central processing unit (CPU) of a computer. In other words, the oscillator circuit 100 may be embedded in a semiconductor integrated circuit device.

The oscillator circuit 100 may output a clock signal necessary for the operation of the semiconductor integrated circuit device as above. Herein, the semiconductor integrated circuit device may further include a digital circuit 10 which operates in synchronization with the clock signal. The semiconductor integrated circuit device may further include a case 20 which protects the oscillator circuit 100 and the digital circuit 10. Herein, the material of the case 20 may be an epoxy molding compound, and the case 20 may be formed in a molding process which is one of the post-process of semiconductors.

When the digital circuit 10 operates, heat may be generated in the semiconductor integrated circuit device.

In general, since the oscillator circuit 100 is sensitive to temperature changes, the oscillator circuit 100 may output a clock signal having a frequency error due to heat generated in the semiconductor integrated circuit device. Herein, the frequency error may mean a deviation between the actual output frequency of the clock signal and a preset target frequency.

In an embodiment, the oscillator circuit 100 may correct a frequency error of a clock signal according to a change in a temperature of the semiconductor integrated circuit device during operation of the semiconductor integrated circuit device.

Figure 2:
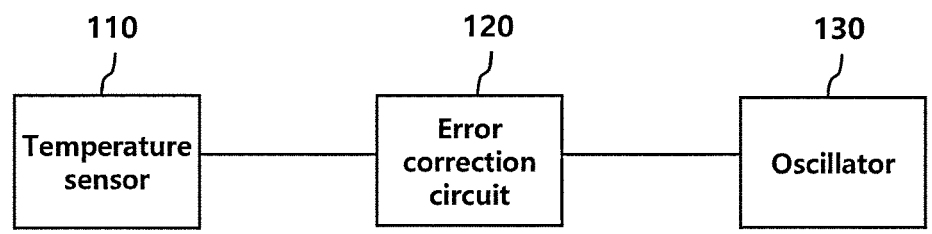
FIGS. 2 and 3 are block diagrams schematically illustrating the configuration of an oscillator circuit according to an embodiment.

Specifically, as illustrated in FIG. 2, the oscillator circuit 100 may include a temperature sensor 110, an error correction circuit 120, and an oscillator 130.

The temperature sensor 110 may sense an internal temperature of the semiconductor integrated circuit device and output a temperature sensing value. Herein, the temperature sensor 110 may generate an analog signal corresponding to the internal temperature.

When the temperature sensor 110 includes an analog-digital converter (ADC) circuit, the temperature sensor 110 may convert an analog signal corresponding to an internal temperature into a digital signal and output the same as a temperature sensing value.

When the temperature sensor 110 does not include an ADC circuit, the temperature sensor 110 may output an analog signal corresponding to an internal temperature as a temperature sensing value. In addition, the oscillator circuit 100 may further include the ADC circuit for converting the temperature sensing value into a digital signal.

The temperature sensor 110 may sense an internal temperature of the semiconductor integrated circuit device at regular intervals and output a temperature sensing value of the corresponding interval. For example, the temperature sensor 110 may sense the internal temperature of the semiconductor integrated circuit device every 0.3 seconds and output the temperature sensing value of the corresponding interval.

This temperature sensor 110 may be disposed adjacent to one side of the oscillator 130 to be described later. Thus, the temperature sensor 110 may sense the temperature around the oscillator 130 which directly affects the oscillator 130.

In an embodiment, the temperature sensor 110 may include a Proportional To Absolute Temperature (PTAT) circuit including a transistor, for example, a Bipolar Junction Transistor (BJT).

The temperature sensor 110 may include resistance temperature detectors whose resistance value changes as an internal temperature of the semiconductor integrated circuit device changes.

When the temperature sensor 110 includes an ADC circuit and a PTAT circuit, the temperature sensor 110 may generate IPTAT or VPTAT (analog signal) corresponding to an internal temperature, and convert the IPTAT or VPTAT into a digital signal and output the same as a temperature sensing value.

Herein, the temperature sensor 110 may directly output a temperature sensing value without correction.

The temperature sensor 110 may correct a temperature sensing value and output the corrected temperature sensing value.

When the semiconductor integrated circuit device operates, the semiconductor integrated circuit device consumes power. In addition, the thermal resistance changes according to the power consumption of the semiconductor integrated circuit device, and the temperature sensor 110 may output a temperature sensing value which is different from the actual internal temperature due to the change in the thermal resistance.

Accordingly, the temperature sensor 110 may correct a temperature sensing value by reflecting the change in thermal resistance according to the power consumption of the semiconductor integrated circuit device, and output the corrected temperature sensing value.

The error correction circuit 120 stores a first error correction value for correcting a frequency error of a clock signal when an internal temperature of the semiconductor integrated circuit device is room temperature and also stores a second error correction value for correcting the frequency error of the clock signal when the internal temperature of the semiconductor integrated circuit device is a high temperature. Here, the room temperature may be a first temperature between 25° C. and 35° C. and the high temperature may be a second temperature between 85° C. and 95° C.

In an embodiment, the first error correction value and the second error correction value may be bias set values which are control values for setting a bias for adjusting an output frequency of a clock signal in the oscillator 130. In other words, the first error correction value and the second error correction value may be a first bias set value and a second bias set value.

The first bias set value and the second bias set value may include a first control code for coarse adjustment of the output frequency and a second control code for fine adjustment of the output frequency.

For example, when the output frequency of the clock signal has a megahertz (Mhz) value, the first control code may be a code for adjusting the megahertz (Mhz) band of the output frequency. In addition, the second control code may be a code for adjusting the kilohertz (Khz) band of the output frequency.

The first control code and the second control code may respectively comprise a plurality of bits. For example, each of the first control code and the second control code may be a 4-bit combination or the first control code may be a 4-bit combination, whereas the second control code may be a 6-bit combination.

The first error correction value and the second error correction value may be resistor capacitor (RC) set values which are control values for setting one or more of a resistor value and a capacitor value for adjusting the output frequency of the clock signal in the oscillator 130. In other words, the first error correction value and the second error correction value may be a first RC set value and a second RC set value.

The error correction circuit 120 may generate an error correction value by using the temperature sensing value input from the temperature sensor 110 and the pre-stored first and second error correction values. Specifically, the error correction circuit 120 may estimate error correction values corresponding to the temperature sensing value by performing interpolation using the temperature sensing value, the first and the second error correction values. In other words, the error correction circuit 120 may generate error correction values corresponding to the temperature sensing value by using the interpolation. Here, the error correction circuit 120 may generate an error correction value by performing linear interpolation using the following equation.

$$f(x) = y_1 + \frac{y_2 - y_1}{x_2 - x_1}(x - x_1) \qquad \text{[Equation 1]}$$

In Equation 1, $y_1$ may mean a first temperature value corresponding to room temperature, $x_1$ may mean a first error correction value, $y_2$ may mean a second temperature value corresponding to a high temperature, $x_2$ may mean a second error correction value, $f(x)$ may mean a temperature sensing value input from the temperature sensor 110, and x may mean an error correction value corresponding to the temperature sensing value.

Figure 9:
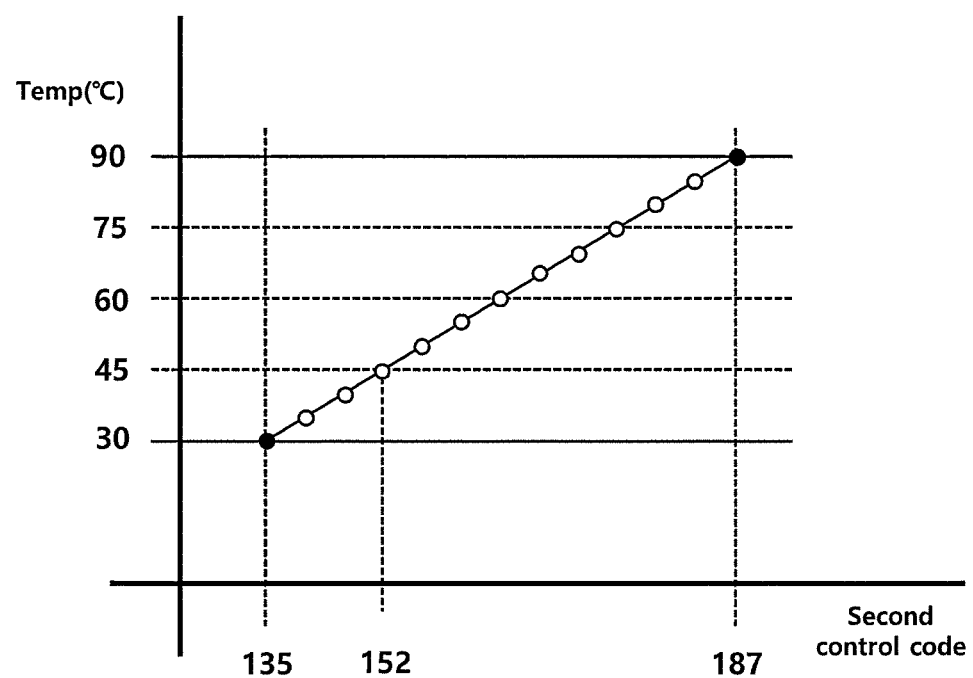
FIG. 9 is a diagram for explaining an operation method of an error correction circuit according to an embodiment.

For example, in FIG. 9, when the first temperature value is 30° C., the second temperature value is 90° C., the temperature sensing value is 45° C., and the error correction value is the bias set value, the error correction circuit 120 may generate a bias set value of which the second control code is 152 by performing linear interpolation using the first error correction value (135 in FIG. 9), the second error correction value (187 in FIG. 9), and the temperature sensing value (45° C.). Herein, since the first control code of the bias set value is a control code for coarse adjustment of the output frequency, the error correction circuit 120 may perform linear interpolation using only the second control code for fine adjustment.

The error correction circuit 120 may deliver the error correction value generated through the interpolation to the oscillator 130. In other words, the error correction circuit 120 may output a digital signal corresponding to the error correction value and transmit the same to the oscillator 130.

The error correction circuit 120 may also generate an error correction value by performing extrapolation using the first error correction value, the second error correction value, and the temperature sensing value.

In other words, when the temperature corresponding to the temperature sensing value is higher than room temperature (e.g., 30° C.) and lower than a high temperature (e.g., 90° C.), the error correction circuit 120 may perform interpolation using the first error correction value, the second error correction value, and the temperature sensing value.

In addition, when the temperature corresponding to the temperature sensing value is lower than room temperature or higher than a high temperature, the error correction circuit 120 may perform extrapolation using the first error correction value, the second error correction value, and the temperature sensing value.

The error correction circuit 120 may generate an error correction value corresponding to the temperature sensing value whenever the temperature sensor 110 periodically outputs the temperature sensing value.

Figure 4:
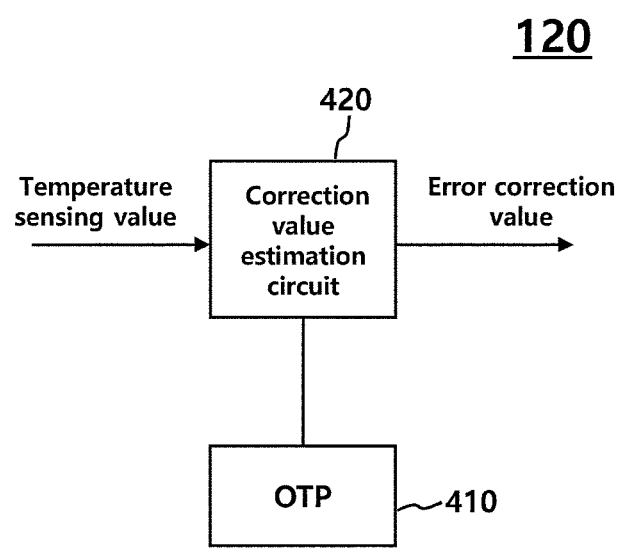
FIG. 4 is a block diagram schematically illustrating the configuration of an error correction circuit according to an embodiment.

The aforementioned error correction circuit 120 may include a one time programmable (OTP) memory 410 and a correction value estimation circuit 420 as illustrated in FIG. 4.

The OTP memory 410 may store a first error correction value and a second error correction value. In addition, the OTP memory 410 may further store a first temperature value corresponding to room temperature and a second temperature value corresponding to a high temperature.

The OTP memory 410 may include one or more of an electrical fuse (eFuse) type OTP memory, a programmable read-only memory (PROM), and an electrically programmable ROM (EPROM).

The correction value estimation circuit 420 may receive a temperature sensing value.

In addition, the correction value estimation circuit 420 may extract the first error correction value and the second error correction value from the OTP memory 410.

The correction value estimation circuit 420 may compare a first temperature value corresponding to room temperature with a temperature sensing value, and may compare a second temperature value corresponding to a high temperature with a temperature sensing value.

Hence, the correction value estimation circuit 420 may check a magnitude relationship between the first temperature value and the temperature sensing value and a magnitude relationship between the second temperature value and the temperature sensing value.

When the temperature corresponding to the temperature sensing value is higher than the first temperature value (room temperature) and lower than the second temperature value (high temperature), the correction value estimation circuit 420 may generate an error correction value corresponding the temperature sensing value by performing linear interpolation using the first error correction value, the second error correction value, and the temperature sensing value.

When the temperature corresponding to the temperature sensing value is lower than the first temperature value (room temperature) or higher than the second temperature value (high temperature), the correction value estimation circuit 420 may generate an error correction value corresponding the temperature sensing value by performing extrapolation using the first error correction value, the second error correction value, and the temperature sensing value.

As described above, the correction value estimation circuit 420 may generate error correction values by estimation using the interpolation or the extrapolation.

The oscillator 130 may output a clock signal necessary for the operation of the semiconductor integrated circuit device.

In an embodiment, the oscillator 130 may set a bias or set one or more of a resistance value and a capacitor value according to an error correction value delivered from the oscillator circuit 100 when outputting a clock signal. In other words, the oscillator 130 may set one or more of a bias, a resistance value, and a capacitor value according to the error correction value. Hence, it is possible to correct the frequency error of the clock signal according to the internal temperature of the semiconductor integrated circuit device. Herein, the bias may be any one of a bias current and a bias voltage.

Figure 10:
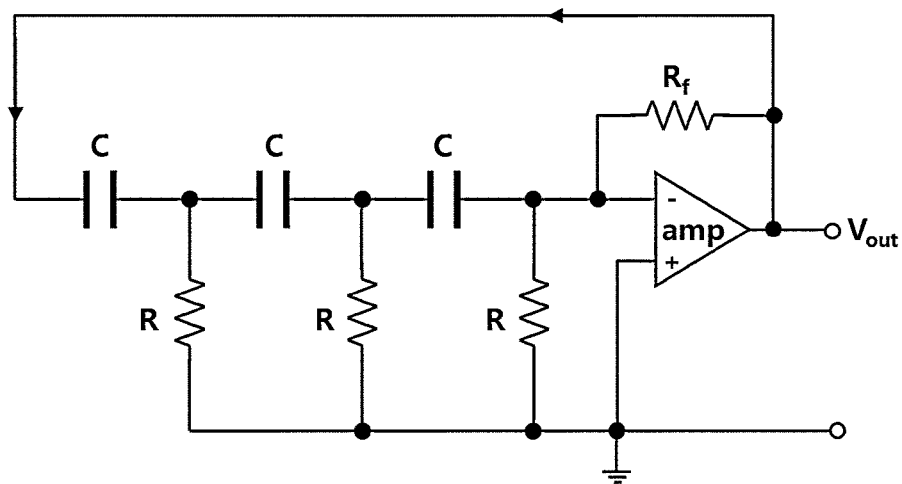
FIGS. 10 and 11 are diagrams exemplarily illustrating a circuit configuration of an oscillator according to an embodiment.
Figure 11:
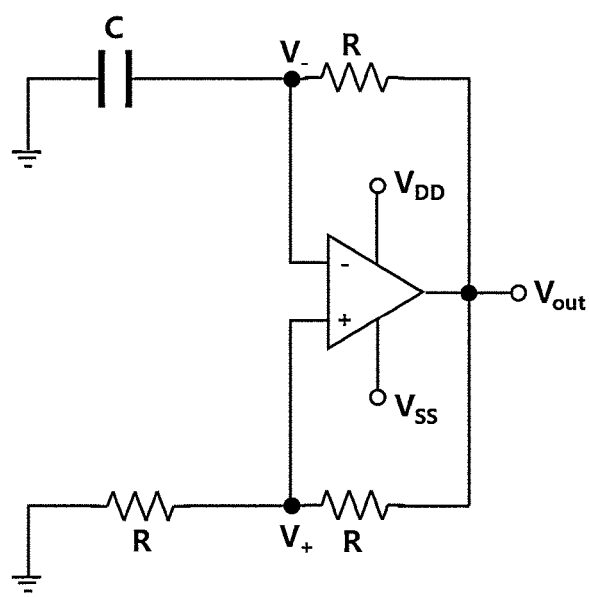

When the oscillator 130 sets one or more of a resistance value and a capacitor value according to the error correction value, the oscillator 130 may include a resistor capacitor (RC) oscillator (see FIG. 10) including one or more of a resistor (R) and a capacitor (C), or a relaxation oscillator (see FIG. 11). In addition, the RC oscillator or relaxation oscillator may include one or more of a variable resistor and a variable capacitor. In FIG. 10, '$R_f$' means a feedback resistance, 'amp' means an amplifier and $V_{out}$ means an output voltage. In FIG. 11, '$V_-$' means a negative voltage, '$V_+$' means a positive voltage, '$V_{DD}$' means a positive power, '$V_{SS}$' means a negative power and '$V_{out}$' means an output voltage.

When the oscillator 130 sets a bias according to the error correction value, the oscillator 130 may include a voltage controlled oscillator (VCO) or a current controlled oscillator (ICO).

From the foregoing, the configuration in which the temperature sensor 110 is included in the oscillator circuit 100 has been described. In other words, the configuration in which the temperature sensor 110 is embedded in the semiconductor integrated circuit device has been described.

Figure 3:
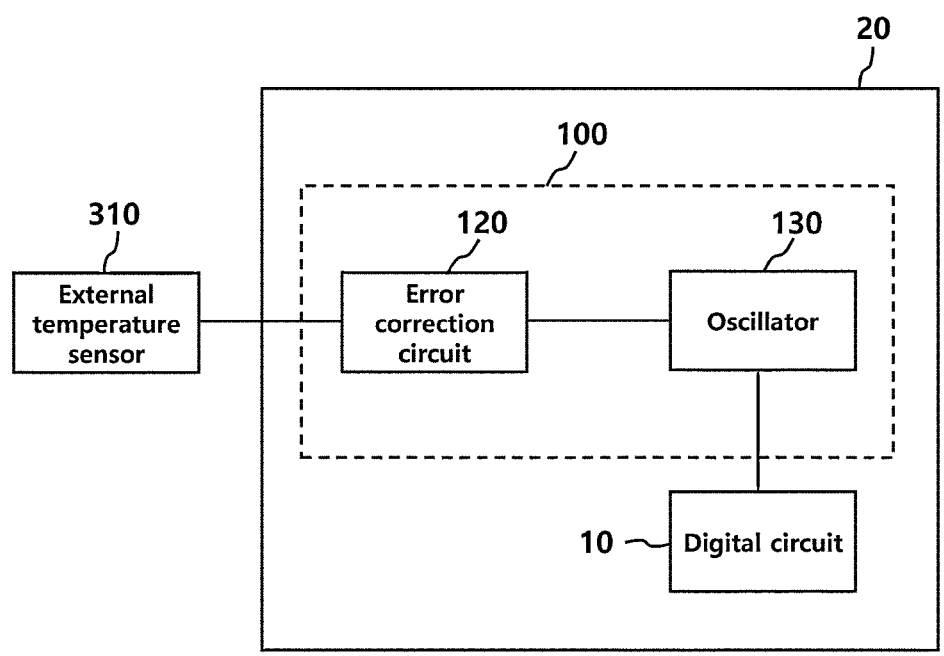

However, an embodiment is not limited thereto, and the temperature sensor 110 may not be included in the oscillator circuit 100 as illustrated in FIG. 3.

In other words, an external temperature sensor 310 separate from the semiconductor integrated circuit device may exist. The external temperature sensor 310 may be disposed adjacent to the semiconductor integrated circuit device. In addition, the external temperature sensor 310 may sense an ambient temperature of the case 20 of the semiconductor integrated circuit device and output a temperature sensing value. The temperature sensing value output from the external temperature sensor 310 may be delivered to the error correction circuit 120 of the oscillator circuit 100 through a communication interface connected between the external temperature sensor 310 and the semiconductor integrated circuit device. Herein, the ambient temperature of the case 20 may be similar to the internal temperature of the semiconductor integrated circuit device.

In FIG. 3, the error correction circuit 120 may generate an error correction value corresponding to a temperature sensing value by performing interpolation or extrapolation using the temperature sensing value delivered from the external temperature sensor 310 and the pre-stored first error correction value and second error correction value.

In addition, in FIG. 3, the oscillator 130 may correct the frequency error of the clock signal using the error correction value.

In an embodiment, the error correction circuit 120 may store a first error correction value and a second error correction value in a wafer test process of the semiconductor integrated circuit device.

Figure 5:
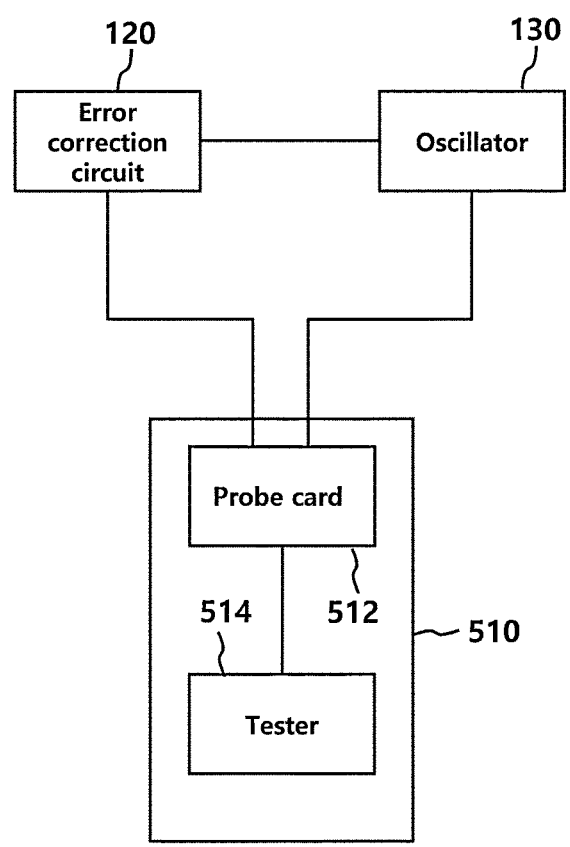
FIG. 5 is a diagram for explaining a connection configuration between an oscillator circuit and a test device according to an embodiment.

Specifically, in the wafer test process of the semiconductor integrated circuit device, the error correction circuit 120 may be electrically connected to a probe card 512 of a test device 510 as illustrated in FIG. 5. In addition, the oscillator 130 may also be electrically connected to the probe card 512. When the oscillator circuit 100 includes the temperature sensor 110, the probe card 512 and the temperature sensor 110 may also be electrically connected.

Although FIG. 5 illustrates a configuration in which the probe card 512 is connected to one semiconductor integrated circuit device, in reality, the probe card 512 may be electrically connected to a plurality of semiconductor integrated circuit devices designed on a wafer.

Figure 6:
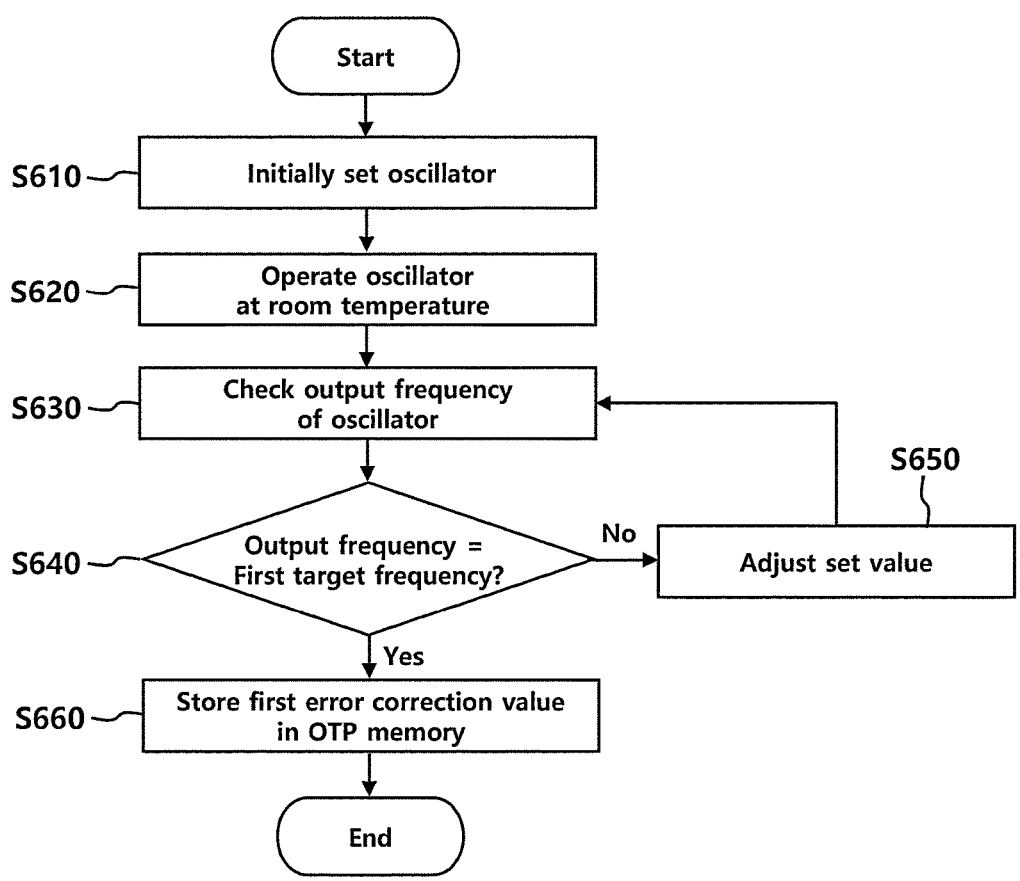
FIGS. 6 and 7 are flowcharts illustrating a test process of an oscillator circuit according to an embodiment.

In a state in which the probe card 512 and the semiconductor integrated circuit device are electrically connected, a tester 514 may store the first error correction value in the OTP memory 410 of the error correction circuit 120 through the process illustrated in FIG. 6.

Referring to FIG. 6, in the wafer test process, the tester 514 may deliver an initial set value to the oscillator 130 through the probe card 512 (S610). Herein, the initial set value may be an initial bias set value or an RC initial set value. When the initial set value is the initial bias set value, the initial set value may include a first control code for coarse adjustment and a second control code for fine adjustment of the output frequency.

The tester 514 may operate the oscillator 130 at room temperature (S620). Herein, the tester 514 may adjust the temperature of a jig (not shown) on which the wafer is seated to make the surface temperature of the wafer to a room temperature. For example, the room temperature may be 30° C., and the tester 514 may adjust the temperature of the jig (not shown) to make the surface temperature of the wafer to 30° C. When the oscillator circuit 100 includes the temperature sensor 110, the surface temperature of the wafer may be known by the tester 514 checking the temperature value sensed by the temperature sensor 110.

When the oscillator circuit 100 does not include the temperature sensor 110, the surface temperature of the wafer may be sensed by the test device 510.

The tester 514 may check the frequency of the clock signal output by the oscillator 130 under room temperatures, that is, the output frequency of the clock signal (S630).

In addition, the tester 514 may compare the output frequency of the clock signal with the first target frequency (S640). Herein, the first target frequency may mean an ideal frequency of the clock signal output from the oscillator 130 under room temperatures.

When the output frequency of the clock signal is different from the first target frequency in stage S640, the tester 514 may adjust the set value of the oscillator 130 one or more times until the output frequency of the clock signal coincides with the first target frequency (S650).

When the output frequency of the clock signal and the first target frequency coincide in stage S640, the tester 514 designates a set value at a corresponding timing as the first error correction value and store the same in the OTP memory 410 of the oscillator circuit 100 (S660). Herein, the tester 514 may further store the first temperature value corresponding to room temperature in the OTP memory 410.

Figure 7:
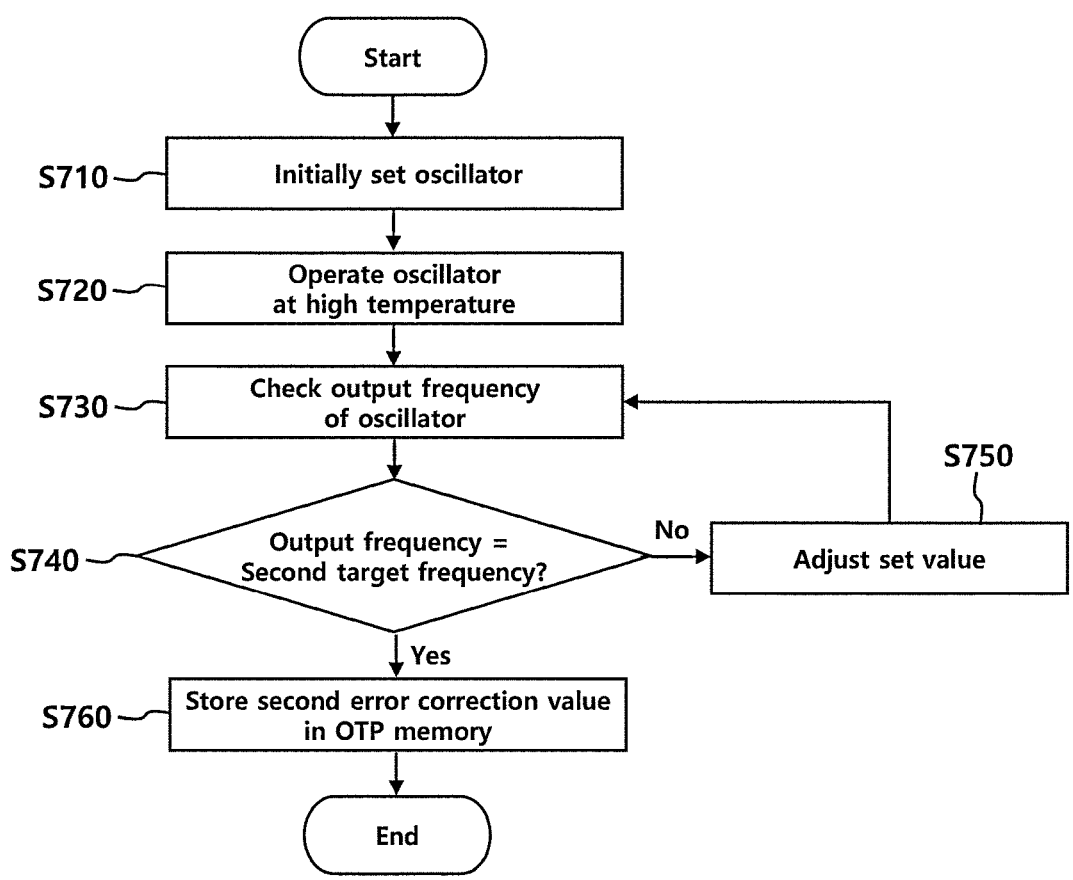

The tester 514 may store the second error correction value in the OTP memory 410 of the error correction circuit 120 through the process illustrated in FIG. 7. Herein, the probe card 512 and the semiconductor integrated circuit device are electrically connected.

Referring to FIG. 7, in the wafer test process, the tester 514 may deliver an initial set value to the oscillator 130 through the probe card 512 (S710).

In addition, the tester 514 may operate the oscillator 130 under a high temperature (S720). Herein, the tester 514 may adjust the temperature of a jig (not shown) on which the wafer is seated to make the surface temperature of the wafer to a high temperature. For example, the high temperature may be 90° C., and the tester 514 may adjust the temperature of the jig (not shown) to make the surface temperature of the wafer to 90° C.

The tester 514 may check the frequency of the clock signal output by the oscillator 130 under a high temperature, that is, the output frequency of the clock signal (S730).

In addition, the tester 514 may compare the output frequency of the clock signal with the second target frequency (S740). Herein, the second target frequency may mean an ideal frequency of the clock signal output from the oscillator 130 under a high temperature.

Under a high temperature condition, the operation of the digital circuit 10 included in the semiconductor integrated circuit device may be deteriorated or loss of the digital circuit 10 may occur. In this connection, by setting the second target frequency to a frequency lower than the first target frequency, loss or deterioration of operation of the digital circuit 10 may be compensated. For example, when the first target frequency is 20 Mhz, the second target frequency may be 19.4 Mhz.

When the output frequency of the clock signal is different from the second target frequency in stage S740, the tester 514 may adjust the set value of the oscillator 130 one or more times until the output frequency of the clock signal coincides with the second target frequency (S750).

When the output frequency of the clock signal and the second target frequency coincide in stage S740, the tester 514 designates a set value at a corresponding timing as the second error correction value and store the same in the OTP memory 410 of the oscillator circuit 100 (S760). Herein, the tester 514 may further store the second temperature value corresponding to a high temperature in the OTP memory 410.

In an embodiment, the tester 514 may perform the process of FIG. 7 after performing the process of FIG. 6. Conversely, after the process of FIG. 7 is performed, the process of FIG. 6 may be performed.

As described above, in the wafer test process, the first error correction value and the second error correction value stored in the OTP memory 410 are not changed when the semiconductor integrated circuit device is used.

As described above, the oscillator circuit 100 stores an error correction value under a room temperature and an error correction value under a high temperature, and generates an error correction value according to a temperature of the semiconductor integrated circuit device through extrapolation or interpolation using two pre-stored error correction values. Hence, the oscillator circuit 100 may operate insensitively to temperature changes.

In addition, since the oscillator circuit 100 generates an error correction value through interpolation or extrapolation, it is not necessary to store error correction values corresponding to a plurality of temperatures in the oscillator circuit 100.

Hereinafter, the process of correcting the frequency error of the clock signal in the oscillator circuit 100 will be described.

Figure 8:
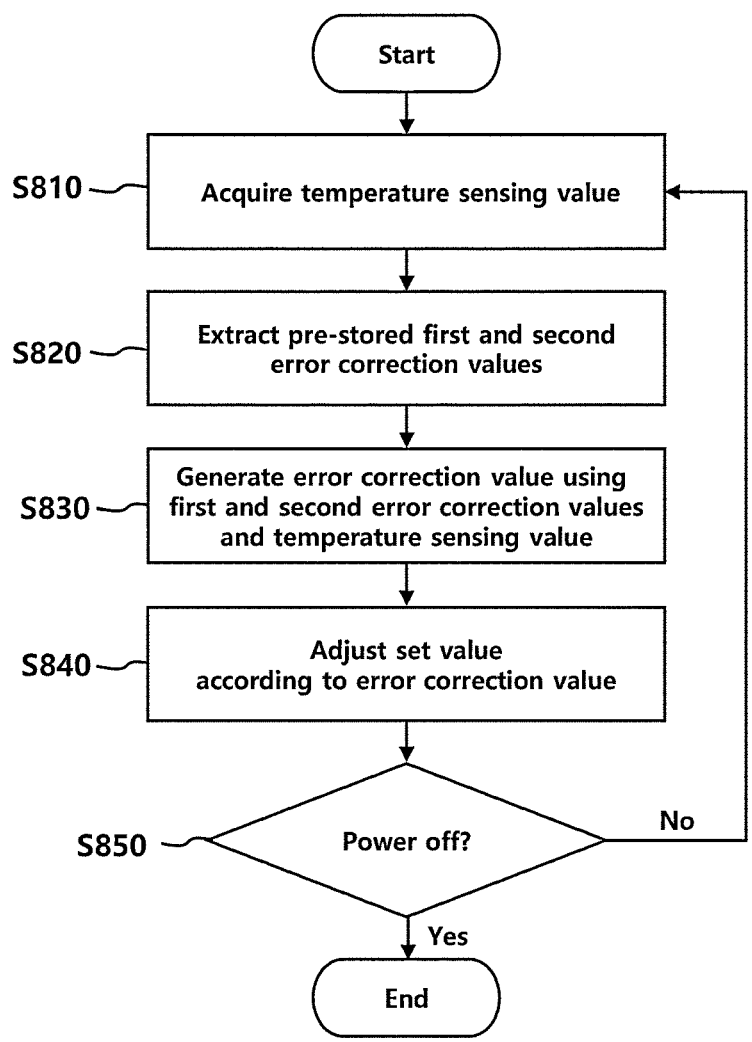
FIG. 8 is a flowchart illustrating an operation process of an oscillator circuit according to an embodiment.

FIG. 8 is a flowchart illustrating an operation process of an oscillator circuit according to an embodiment.

Referring to FIG. 8, during operation of the semiconductor integrated circuit device, the oscillator circuit 100 may sense the temperature of the semiconductor integrated circuit device to generate a temperature sensing value (S710). Herein, the temperature of the semiconductor integrated circuit device may be an internal temperature of the case 20 or an ambient temperature of the case 20.

In addition, the oscillator circuit 100 may extract the first error correction value and the second error correction value stored in the OTP memory 410, which is an internal memory, from the internal memory (S820). Herein, the first error correction value may be a bias set value or RC set value for correcting a frequency error of the clock signal when the temperature of the semiconductor integrated circuit device is room temperature, and the second error correction value may be a bias set value or RC set value for correcting the frequency error of the clock signal when the temperature of the semiconductor integrated circuit device is a high temperature higher than room temperature.

The oscillator circuit 100 may generate an error correction value corresponding to the temperature sensing value using the first error correction value, the second error correction value, and the temperature sensing value (S830).

Thereafter, the oscillator circuit 100 may correct the frequency error of the clock signal according to the internal temperature by setting a bias according to the error correction value or by setting one or more of a resistance value and a capacitor value (S840).

The oscillator circuit 100 may repeat stages S810 to S840 at regular intervals until the power of the semiconductor integrated circuit device is turned off (S850).

When the temperature corresponding to the temperature sensing value is higher than the room temperature and lower than the high temperature in stage S830, the oscillator circuit 100 may generate the error correction value corresponding the temperature sensing value by performing linear interpolation using the first error correction value, the second error correction value, and the temperature sensing value.

When the temperature corresponding to the temperature sensing value in stage S830 is lower than the room temperature or higher than the high temperature, the oscillator circuit 100 may generate the error correction value corresponding the temperature sensing value by performing extrapolation using the first error correction value, the second error correction value, and the temperature sensing value.

Hereinafter, an example in which the oscillator circuit 100 is applied to a source driver IC of a display device will be described.

Figure 12:
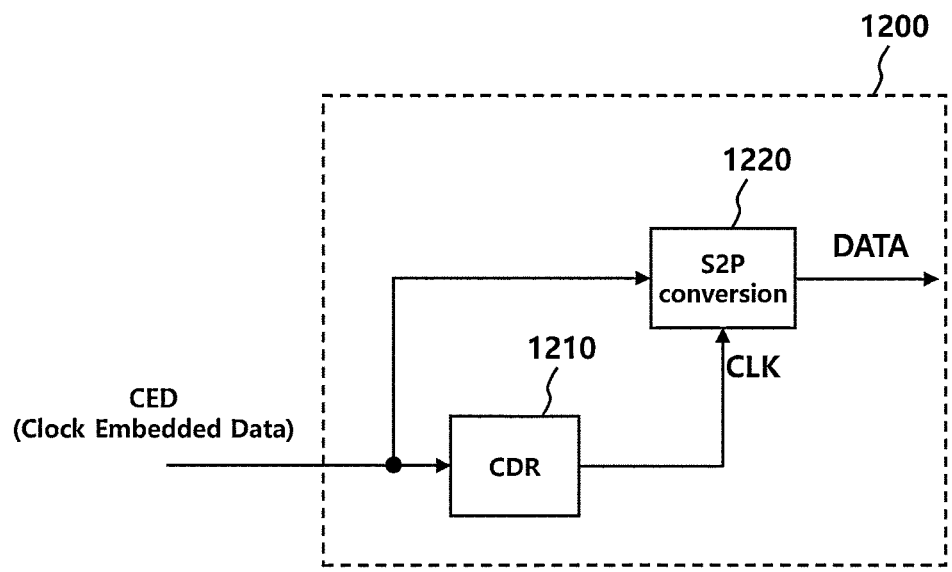
FIG. 12 is a diagram for an example in which an oscillator circuit according to an embodiment is applied to a source driver IC.

FIG. 12 is a diagram for an example in which an oscillator circuit according to an embodiment is applied to a source driver IC.

Referring to FIG. 12, the semiconductor integrated circuit device according to an embodiment may be a source driver IC 1200, the oscillator circuit 100 may be a clock recovery circuit 1210 (Clock Data Recovery), and the digital circuit may be a serial-parallel conversion circuit 1220 included in the source driver IC 1200, a shift register circuit (not shown), or the like.

The clock recovery circuit 1210 may receive a communication signal (CED, Clock Embedded Data) from a timing controller (not shown), and may recover a communication clock CLK included in the communication signal CED.

The serial-to-parallel conversion circuit 1220 may receive a communication signal from a timing controller (not shown).

The serial-to-parallel conversion circuit 1220 may convert serial data included in the communication signal into parallel data by using the communication clock CLK recovered by the clock recovery circuit 1210. Herein, serial data and parallel data may include image data.

Figure 13:
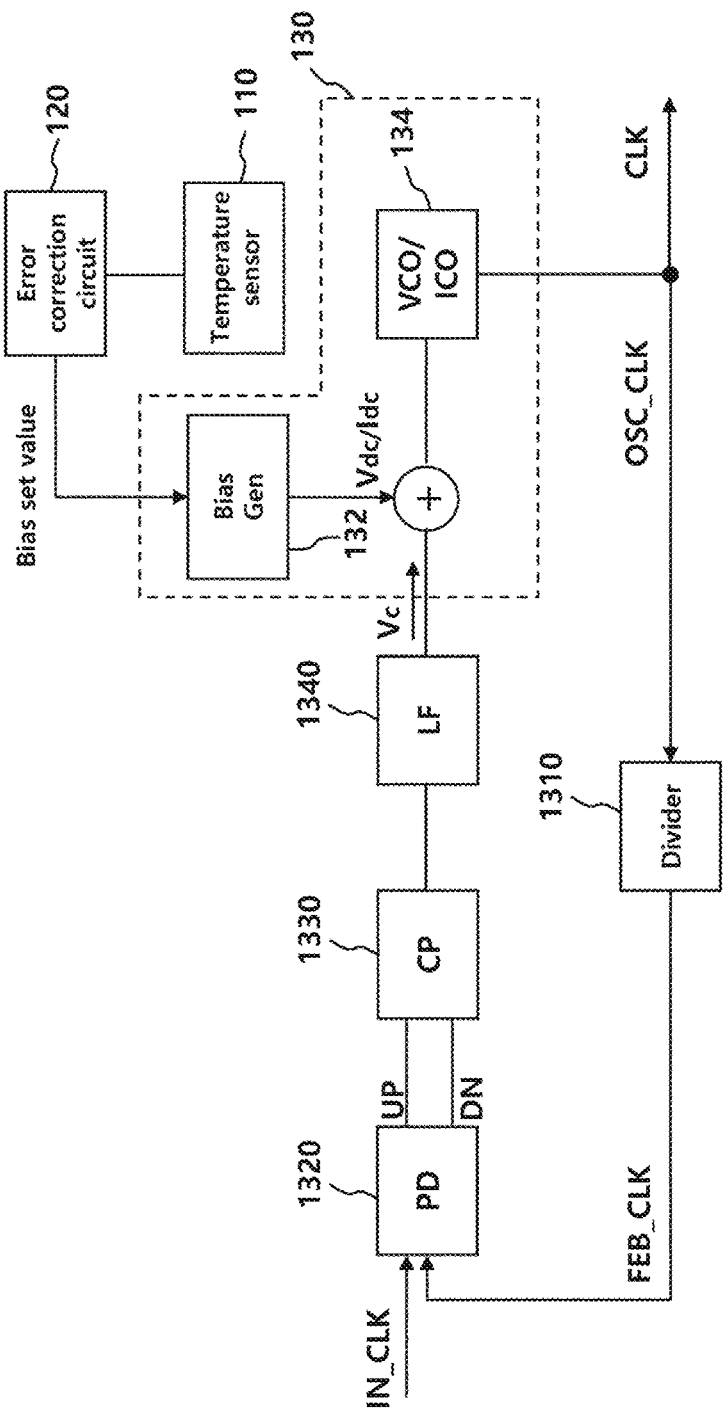
FIG. 13 is a diagram for explaining the configuration of a clock recovery circuit including an oscillator circuit according to an embodiment.

FIG. 13 is a diagram for explaining the configuration of a clock recovery circuit including an oscillator circuit according to an embodiment.

Referring to FIG. 13, the clock recovery circuit 1210 may include the temperature sensor 110, the error correction circuit 120, and the oscillator 130. In addition, the clock recovery circuit 1210 may further include a divider 1310, a phase detector 1320, a charge pump 1330, and a loop filter 1340.

The divider 1310 may divide the output frequency of the clock signal OSC_CLK output from the oscillator 130 by a certain ratio.

Hence, the divider 1310 may output the feedback signal FEB_CLK having a frequency obtained by dividing the output frequency of the clock signal OSC_CLK by a certain ratio.

The phase detector 1320 detects a phase difference between the input signal IN_CLK and the feedback signal FEB_CLK having a frequency obtained by dividing the communication frequency, which is the frequency of the communication signal CED, by a certain ratio, and outputs an Up signal or a Down signal therefor.

When the phase difference between the input signal IN_CLK and the feedback signal FEB_CLK is reduced, the frequency and pulse width of outputting an Up signal or a Down signal from the phase detector 1320 may be reduced.

The charge pump 1330 operates to charge or discharge charges in the capacitor of the loop filter 1340 according to the pulse width of the Up signal or the Down signal of the phase detector 1320.

Herein, the charge pump 1330 may charge electric charges to the capacitor of the loop filter 1340 when it is an Up signal, and discharge electric charges from the capacitor of the loop filter 1340 when it is a Down signal.

The loop filter 1340 may increase or decrease a control voltage $V_c$ by charging or discharging electric charges to and from the capacitor by the charge pump 1330. In addition, the loop filter 1340 may output a control signal having a control voltage $V_c$. Herein, the loop filter 1340 may remove unnecessary components, such as harmonics, from an Up signal or a Down signal.

In FIG. 13, the oscillator 130 may include a bias generation circuit 132 and a controlled oscillator 134, VCO/ICO.

The bias generation circuit 132 of the oscillator 130 may receive an error correction value from the error correction circuit 120. In addition, the bias generation circuit 132 may set the size of a bias according to the error correction value. Here, the bias may be a bias current $I_{dc}$ or a bias voltage $V_{dc}$.

The controlled oscillator 134 may receive a bias whose size is set according to the error correction value from the bias generation circuit 132. Hence, the controlled oscillator 134 may correct a frequency error of the clock signal OSC_CLK according to the internal temperature of the source driver IC 1200.

The controlled oscillator 134 outputting the clock signal OSC_CLK having the frequency error corrected may adjust the phase of the clock signal OSC_CLK using the control voltage $V_c$.

When the phase difference between the input signal IN_CLK and the feedback signal FEB_CLK is eliminated through phase adjustment of the clock signal OSC_CLK, the clock recovery circuit 1210 may recover the communication clock CLK.

In other words, the clock recovery circuit 1210 may recover the communication clock CLK using the clock signal OSC_CLK for which the frequency error is corrected.

What is claimed is:

1. An oscillator circuit, comprising:
a temperature sensor to sense a temperature inside a semiconductor integrated circuit device and to output a temperature sensing value;
an error correction circuit to store a first error correction value for correcting a frequency error of a clock signal when the temperature inside the semiconductor integrated circuit device is a first temperature and a second error correction value for correcting the frequency error of the clock signal when the temperature inside the semiconductor integrated circuit device is a second temperature higher than the first temperature and to generate a third error correction value corresponding to the temperature sensing value by using the first error correction value, the second error correction value, and the temperature sensing value; and
an oscillator to correct the frequency error of the clock signal according to the temperature inside the semiconductor integrated circuit device by setting at least one of a bias, a resistance value, and a capacitor value according to the third error correction value and to output the clock signal, wherein
the third error correction value includes a first control code for a coarse adjustment of a frequency of the clock signal and a second control code for a fine adjustment of the frequency of the clock signal.

2. The oscillator circuit of claim 1, wherein the first error correction value and the second error correction value are bias set values for setting the bias in the oscillator.

3. The oscillator circuit of claim 1, wherein the first error correction value and the second error correction value are resistor capacitor (RC) set values for setting at least one of the resistance value and the capacitor value in the oscillator.

4. The oscillator circuit of claim 1, wherein the error correction circuit includes:
a one time programmable (OTP) memory to store the first error correction value and the second error correction value; and
a correction value generation circuit to receive the temperature sensing value, to generate the third error correction value by performing a linear interpolation using the first error correction value, the second error correction value, and the temperature sensing value, and to output the third error correction value to the oscillator.

5. The oscillator circuit of claim 4, wherein the first error correction value and the second error correction value are stored in the OTP memory in a wafer test process of the semiconductor integrated circuit device.

6. The oscillator circuit of claim 1, wherein the temperature sensor is configured to periodically sense a temperature inside the semiconductor integrated circuit device and output a temperature sensing value of a corresponding period.

7. The oscillator circuit of claim 1, wherein the temperature sensor is disposed adjacent to one side of the oscillator in the semiconductor integrated circuit device.

8. The oscillator circuit of claim 1, wherein, when a temperature corresponding to the temperature sensing value is higher than the first temperature and lower than the second temperature, the error correction circuit is configured to generate the third error correction value by performing an interpolation using the first error correction value, the second error correction value, and the temperature sensing value.

9. The oscillator circuit of claim 1, wherein, when a temperature corresponding to the temperature sensing value is lower than the first temperature or higher than the second temperature, the error correction circuit is configured to generate the third error correction value by performing an extrapolation using the first error correction value, the second error correction value, and the temperature sensing value.

10. A semiconductor integrated circuit device, comprising:
an oscillator circuit, protected by a case, comprising:
an error correction circuit to store a first error correction value for correcting a frequency error of a clock signal when an ambient temperature of the case is a first temperature and a second error correction value for correcting the frequency error of the clock signal when the ambient temperature of the case is a second temperature, which is higher than the first temperature, to receive a temperature sensing value for the ambient temperature of the case from an external circuit, and to generate a third correction value corresponding to the temperature sensing value by using the first error correction value, the second error correction value, and the temperature sensing value; and
an oscillator to correct the frequency error of the clock signal according to the ambient temperature by setting at least one of a bias, a resistance value, and a capacitor value according to the third error correction value and to output the clock signal; and
a digital circuit, protected by the case, operating in synchronization with the clock signal,
wherein the third error correction value includes a first control code for a coarse adjustment of a frequency of the clock signal and a second control code for a fine adjustment of the frequency of the clock signal.

11. The semiconductor integrated circuit device of claim 10, wherein, when the ambient temperature corresponding to the temperature sensing value is higher than the first temperature and lower than the second temperature, the error correction circuit is configured to generate the third error correction value by performing an interpolation using the first error correction value, the second error correction value, and the temperature sensing value.

12. The semiconductor integrated circuit device of claim 10, wherein, when the ambient temperature corresponding to the temperature sensing value is lower than the first temperature or higher than the second temperature, the error correction circuit is configured to generate the third error correction value by performing an extrapolation using the first error correction value, the second error correction value, and the temperature sensing value.

13. The semiconductor integrated circuit device of claim 10, wherein:
the semiconductor integrated circuit device is a source driver integrated circuit (IC); and
the oscillator circuit is included in a clock recovery circuit of the source driver IC.

14. The semiconductor integrated circuit device of claim 13, wherein the clock recovery circuit is configured to receive a communication signal from a timing controller (T-CON) and recover a communication clock included in the communication signal by using the clock signal.

15. The semiconductor integrated circuit device of claim 10, wherein the first control code and the second control code are respectively formed of a plurality of bits.

16. The semiconductor integrated circuit device of claim 10, wherein the error correction circuit is configured to receive the temperature sensing value from an external temperature sensor disposed adjacent to the semiconductor integrated circuit device.

17. A method for frequency correction of an oscillator circuit, the method comprising:
acquiring, by the oscillator circuit of a semiconductor integrated circuit device, a temperature sensing value for a temperature of the semiconductor integrated circuit device;
extracting, from an internal memory, a first error correction value for correcting a frequency error of a clock signal when a temperature of the semiconductor integrated circuit device is a first temperature and a second error correction value for correcting the frequency error of the clock signal when the temperature of the semiconductor integrated circuit device is a second temperature higher than the first temperature;
generating a third correction value corresponding to the temperature sensing value by using the first error correction value, the second error correction value, and the temperature sensing value, the third error correction value including a first control code for a coarse adjustment of a frequency of the clock signal and a second control code for a fine adjustment of the frequency of the clock signal; and
setting at least one of a bias, a resistance value, and a capacitor value according to the third error correction value in order to control a frequency of the clock signal; and
outputting the clock signal in which the frequency error is corrected according to the temperature of the semiconductor integrated circuit device.

18. The method of claim 17, wherein, in generating the third error correction value, when a temperature corresponding to the temperature sensing value is higher than the first temperature and lower than the second temperature, the oscillator circuit is configured to generate the third error correction value by performing an interpolation.

19. The method of claim 17, wherein, in acquiring the temperature sensing value, the oscillator circuit is configured to directly sense the temperature of the semiconductor integrated circuit device to generate the temperature sensing value or receive the temperature sensing value from an external temperature sensor disposed adjacent to the semiconductor integrated circuit device.

* * * * *